(12) United States Patent
Chen et al.

(10) Patent No.: US 8,144,501 B2
(45) Date of Patent: Mar. 27, 2012

(54) READ/WRITE MARGIN IMPROVEMENT IN SRAM DESIGN USING DUAL-GATE TRANSISTORS

(75) Inventors: Yen-Huei Chen, Hsin-Chu (TW); Jui-Jen Wu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 470 days.

(21) Appl. No.: 12/345,125

(22) Filed: Dec. 29, 2008

(65) Prior Publication Data

US 2010/0165707 A1 Jul. 1, 2010

(51) Int. Cl.
*G11C 11/00* (2006.01)
(52) U.S. Cl. ............ 365/154; 365/189.11; 365/226
(58) Field of Classification Search .......... 365/154, 365/189.11, 226
See application file for complete search history.

(56) References Cited

U.S. PATENT DOCUMENTS

| | | | |
|---|---|---|---|
| 5,715,191 A * | 2/1998 | Yamauchi et al. ........... 365/156 |
| 6,061,267 A * | 5/2000 | Houston ....................... 365/154 |
| 6,706,571 B1 | 3/2004 | Yu et al. |
| 6,858,478 B2 | 2/2005 | Chau et al. |
| 7,119,601 B2 | 10/2006 | Grimone, III |
| 7,190,050 B2 | 3/2007 | King et al. |
| 7,247,887 B2 | 7/2007 | King et al. |
| 7,265,008 B2 | 9/2007 | King et al. |
| 7,508,031 B2 | 3/2009 | Liu et al. |
| 7,528,465 B2 | 5/2009 | King et al. |
| 7,605,449 B2 | 10/2009 | Liu et al. |
| 2005/0153490 A1 | 7/2005 | Yoon et al. |
| 2006/0274569 A1 * | 12/2006 | Joshi et al. ................... 365/154 |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0183185 A1 | 8/2007 | Guo et al. |
| 2007/0189060 A1 * | 8/2007 | Inaba ........................... 365/154 |
| 2008/0290470 A1 | 11/2008 | King et al. |
| 2008/0296632 A1 | 12/2008 | Moroz et al. |
| 2009/0181477 A1 | 7/2009 | King et al. |
| 2010/0027322 A1 * | 2/2010 | Yamaoka et al. ............ 365/156 |
| 2010/0188889 A1 * | 7/2010 | Hanafi .......................... 365/156 |

* cited by examiner

*Primary Examiner* — Vu Le
*Assistant Examiner* — Han Yang
(74) *Attorney, Agent, or Firm* — Slater & Matsil, L.L.P.

(57) ABSTRACT

An integrated circuit structure includes a static random access memory (SRAM) cell. The SRAM cell includes a pull-up transistor and a pull-down transistor forming an inverter with the pull-up transistor. The pull-down transistor includes a front gate connected to a gate of the pull-up transistor, and a back-gate decoupled from the front gate.

23 Claims, 4 Drawing Sheets

READ/WRITE MARGIN IMPROVEMENT IN SRAM DESIGN USING DUAL-GATE TRANSISTORS

TECHNICAL FIELD

This invention relates generally to integrated circuits, and more particularly to memory cell design, and even more particularly to the structure and operations of static random access memory (SRAM) cells.

BACKGROUND

Static random access memory (SRAM) is commonly used in integrated circuits. SRAM cells have the advantageous feature of holding data without a need for refreshing. SRAM cells may include different numbers of transistors, and are often accordingly referred to by the number of transistors, for example, six-transistor (6-T) SRAM, eight-transistor (8-T) SRAM, and the like. The transistors typically form a data latch for storing a bit. Additional transistors may be added to control access to the transistors. SRAM cells are typically arranged as an array having rows and columns. Typically, each row of the SRAM cells is connected to a word-line, which determines whether the current SRAM cell is selected or not. Each column of the SRAM cells is connected to a bit-line (or a pair of bit-lines), which is used for storing a bit into, or read a bit from, the SRAM cell.

With the down-scaling of integrated circuits, the power supply voltages of the integrated circuits are reduced, along with the operation voltages of memory circuits. Accordingly, read and write margins of the SRAM cells, which are used to indicate how reliably the bits of the SRAM cells can be read from and written into, are reduced. Due to the existence of static noise, the reduced read and write margins may cause errors in the respective read and write operations. Further, with the reduction in the power supply voltages, the speeds of the operations are also reduced.

Various approaches have been explored to reduce the supply voltage of SRAM cells in read and write operations. For example, FIG. 1 illustrates a portion of a column of self-feedback six-transistor (6-T) SRAM cells including SRAM cell 100 and SRAM cell 200. In each of the SRAM cells 100 and 200, pass-gate transistors 102/104 and 202/204 are dual-gate transistors including front gates 110/114 and 210/214 and back-gates 112/116 and 212/216. The back-gates 112/116 and 212/216 of the pass-gate transistors are connected to storage nodes 106/108 and 206/208, respectively. In a write operation, SRAM cell 100 is selected for writing a "1" (VDD) from bit-line BL and a "0" (VSS) from bit-line BLB. SRAM cell 200 is unselected. Node 106 is at a high voltage, and hence the back-gate 112 of pass-gate transistor 102 is turned on. Therefore, pass-gate transistor 102 is enhanced during the write operation, and the write ability of SRAM cell 100 is enhanced.

The above-discussed structure, however, suffers from drawbacks. For unselected SRAM cell 200, assuming node 206 also stores a "1," the respective pass-gate transistor 202 is also enhanced due to the fact that the back-gate of pass-gate transistor 202 is connected to node 206. Therefore, pass-gate transistor 202 may be partially turned on, or at least has a high leakage current since bit-line BLB is at voltage VSS. This may cause an erroneous flip of SRAM cell 200. An additional problem of the convention structure is that SRAM cells 100 and 200 may need to be laid out in such a way that the P-well or N-well regions have zigzag patterns, which adversely affect the scalability of the respective SRAM cells. Alternative solutions are thus needed to solve the above-discussed problems.

SUMMARY OF THE INVENTION

In accordance with one aspect of the present invention, an integrated circuit structure includes a static random access memory (SRAM) cell. The SRAM cell includes a pull-up transistor and a pull-down transistor forming an inverter with the pull-up transistor. The pull-down transistor includes a front gate connected to a gate of the pull-up transistor, and a back-gate decoupled from the front gate.

In accordance with another aspect of the present invention, an integrated circuit structure includes a word-line and a Y-direction select line. An SRAM cell is coupled to the word-line. The SRAM cell includes a first inverter having a first pull-up transistor, and a first pull-down transistor coupled to the first pull-up transistor, wherein the first pull-down transistor has a first front gate and a first back-gate. The SRAM cell further includes a second inverter cross-coupled to the first inverter and having a second pull-up transistor; and a second pull-down transistor coupled to the second pull-up transistor. The second pull-down transistor has a second front gate and a second back-gate. The first back-gate and the second back-gate are connected to the Y-direction select line.

In accordance with yet another aspect of the present invention, an integrated circuit structure includes SRAM cells arranged as an array with rows and columns, wherein each of the SRAM cells includes a first inverter and a second inverter. The first inverter is coupled to a power supply voltage node and having a first pull-up transistor and a first pull-down transistor coupled to the first pull-up transistor. The first pull-down transistor has a first front gate and a first back-gate. The second inverter is cross-coupled to the first inverter and the power supply voltage node. The second inverter has a second pull-up transistor and a second pull-down transistor coupled to the second pull-up transistor. The second pull-down transistor has a second front gate and a second back-gate, wherein the first back-gate and the second back-gate are interconnected. The integrated circuit structure further includes Y-direction select lines extending in a column direction, wherein each of the Y-direction select lines is coupled to the first back-gate and the second back-gate of all of the SRAM cells in a same column.

The advantageous features of the present invention include reliable SRAM cells having improved write ability, low leakage currents during sleep mode operations, and improved immunity to read disturbance. In addition, substantially no chip-area penalty is incurred.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the present invention are discussed in detail below. It should be appreciated, however, that the embodiments of the present invention provide many applicable inventive concepts that can be embodied in a wide variety of specific contexts. The specific embodiments discussed are merely illustrative of specific ways to make and use the invention, and do not limit the scope of the invention.

A novel static random access memory (SRAM) cell embodiment is provided. The variations and operation of the embodiment are discussed. Throughout the various views and illustrative embodiments of the present invention, like reference numbers are used to designate like elements.

Figure 1:
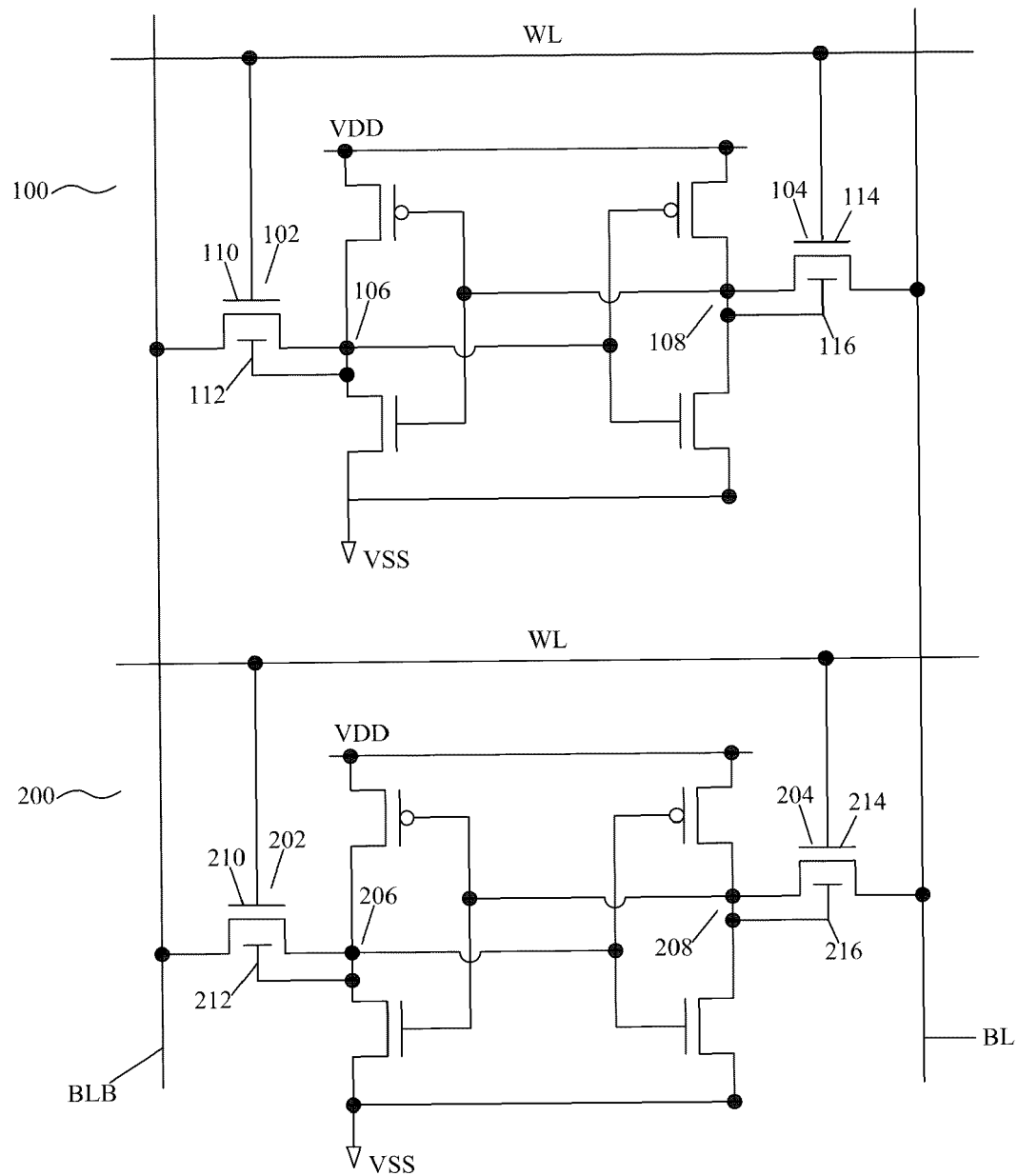
FIG. 1 illustrates two conventional 6-T static random access memory (SRAM) cells, wherein back-gates of pass-gate transistors are connected to storage nodes of the respective SRAM cells.
Figure 2:
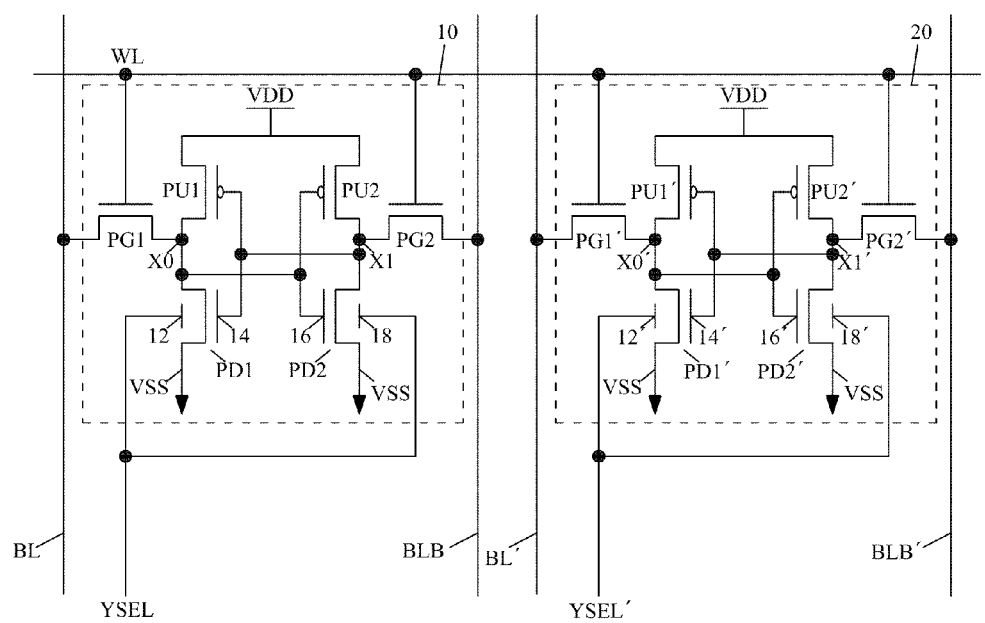
FIG. 2 illustrates an embodiment of the present invention, wherein back-gates of pull-down transistors in an SRAM cell are interconnected.

FIG. 2 illustrates an embodiment of the present invention, which includes six-transistor (6-T) SRAM cells 10 and 20. SRAM cell 10 includes pull-up transistors (PMOS transistors) PU1 and PU2, pull-down transistors (NMOS transistors) PD1 and PD2, and pass-gate transistor PG1 and PG2. The drains of pull-up transistor PU1 and pull-down transistor PD1 are interconnected to form an inverter, and the drains of pull-up transistor PU2 and pull-down transistor PD2 are interconnected to form another inverter. The two inverters are cross-coupled to form a data latch. Storage node X0 of the data latch is coupled to bit-line BL through pass-gate transistor PG1, while storage node X1 is coupled to bit-line BLB through pass-gate transistor PG2. Storage nodes X0 and X1 are complementary nodes that are often at opposite logic levels (logic high or logic low). The gates of pass-gate transistors PG1 and PG2 are connected to word-line WL. SRAM cell 10 is coupled between power supply voltages (also referred to as operation voltages) VDD and VSS. SRAM cell 20 has an identical structure as SRAM 10. For the convenience of the discussion, each of the elements in SRAM cell 20 is referred to using a same reference notation as the like elements in SRAM cell 10, with each of the reference notation followed by a "'" sign.

Pull-down transistors PD1 and PD2 are dual-gate transistors, each having a front gate 14/16 and a back-gate 12/18. Front gates 14/16 of the pull-down transistors PD1 and PD2 are connected to the respective gates of pull-up transistors PU1 and PU2, respectively. Back-gate 12/18 of the respective pull-down transistors PD1 and PD2 are interconnected, and are connected to Y-direction select line YSEL. Similarly, pull-down transistors PD1' and PD2' are dual-gate transistors, each having front gate 14'/16' and back-gate 12'/18'. Front gates 14'/16' of pull-down transistors PD1' and PD2' are connected to the gates of pull-up transistors PU1' and PU2', respectively. Back-gates 12' and 18' of the respective pull-down transistors PD1' and PD2' are interconnected, and are connected to Y-direction select line YSEL'. Transistors PG1, PG2, PU1, and PU2, and transistors PG1', PG2', PU1', and PU2' may each be a single-gate transistor that includes only one gate, or a dual-gate transistor having a front gate and a back-gate interconnected to act as a single-gate transistor.

Y-direction select line YSEL' and Y-direction select line YSEL are separated from each other, and may be applied with different voltages at a same time. The preferable voltages depend on the respective operations of the connecting SRAM cells, as will be discussed in detail in subsequent paragraphs.

In the following discussion, it is assumed that SRAM cell 10 is selected for a write or read operation, while SRAM cell 20 is an unselected cell.

In a write operation, SRAM cell 10 is selected for being written into, word-line WL thus carries a logic high signal "1," for example, voltage VDD. In an embodiment, Y-direction select line YSEL carries a low voltage, for example, lower than the threshold voltages of the back-gate 12 of pass-gate transistor PD1 and back-gate 18 of pass-gate transistor PD2. In alternative embodiments, Y-direction select line YSEL is applied with voltage VSS, which may be the electrical ground (0V). In yet other embodiments, Y-direction select line YSEL is applied with a negative voltage, for example, between 0V or about −0.2V, and more negative voltages can make SRAM cell 10 weaker. The low voltage weakens pull-down transistors PD1 and PD2. This is equivalent to reducing the β ratio of SRAM cell 10. Assuming that before the write operation, node X0 stores a "1," while node X1 stores a "0," and bit-line BL has a "1," and bit-line BLB has a "0," with a weakened pull-down transistor PD1, it is easy to pull node X0 from "0" to "1." The write operation is thus easier and faster.

At the time SRAM cell 10 is written into, the unselected SRAM cell 20 experiences a dummy read operation. Y-direction select line YSEL' is set to a high voltage. Accordingly, pull-down transistor PD1 is strengthened. This reduces the dummy read disturb to SRAM cell 20. For example, if node X0' stores a "0," since both bit-lines BL' and BLB' are pre-charged to VDD, it is more difficult to pull node X0' from "0" to "1." The values stored in the unselected SRAM cell 20 will thus be retained reliably.

In a read operation of SRAM cell 10, word-line WL carries a logic high signal "1." Y-direction select lines YSEL and YSEL' both carry a high voltage, for example, about 0.2V or VDD, to the back-gates of pull-down transistors PD1, PD2, PD1' and PD2'. The high voltage applied on selected SRAM cell 10 strengthens pull-down transistors PD1 and PD2, which is equivalent to increasing the β ratio of SRAM cells 10 and 20. Assuming that at this time, node X0 stores a "1," while node X1 stores a "0," and bit-line BL, BL', BLB, and BLB' are all pre-charged to "1," with a strengthened pull-down transistor PD1, the read disturb to SRAM cell 10 is reduced. The read operation is thus more reliable. Similarly, the strengthened pull-down transistor PD1' results in the dummy read disturb to SRAM cell 20 to be reduced as well.

During the read and write operations of SRAM cell 10, the SRAM cells in unselected rows of SRAM cell 10 (not shown in FIG. 2, please refer to FIG. 3) have their word-lines WL turned off, wherein the unselected rows are the rows that have no selected SRAM cells read from or written into. Accordingly, the unselected SRAM cells in unselected rows are not affected by the voltages on Y-direction select lines YSEL and YSEL', and the values stored in these SRAM cells will be retained.

In a sleep mode, which may be part of a power-down process, all word lines WL are turned off, and the SRAM cells are neither written into, nor read from. The leakage of the SRAM cells thus becomes one of the major concerns. Referring again to FIG. 2, all Y-direction select lines, including YSEL and YSEL' are preferably connected to a low voltage, and more preferably a ground voltage (0V), and even more preferably a negative voltage, so that the leakage through pull-down transistors PD1, PD2, PD1', and PD2' is reduced. Further, all pull-down transistors in all of the SRAM cells are preferably turned off fully. Accordingly, the voltage connected to Y-direction select lines YSEL and YSEL' may have a lower level (more toward the negative side) than the voltage on the YSEL that is connected to a selected SRAM cell in the write operation of the selected SRAM cell.

Figure 3:
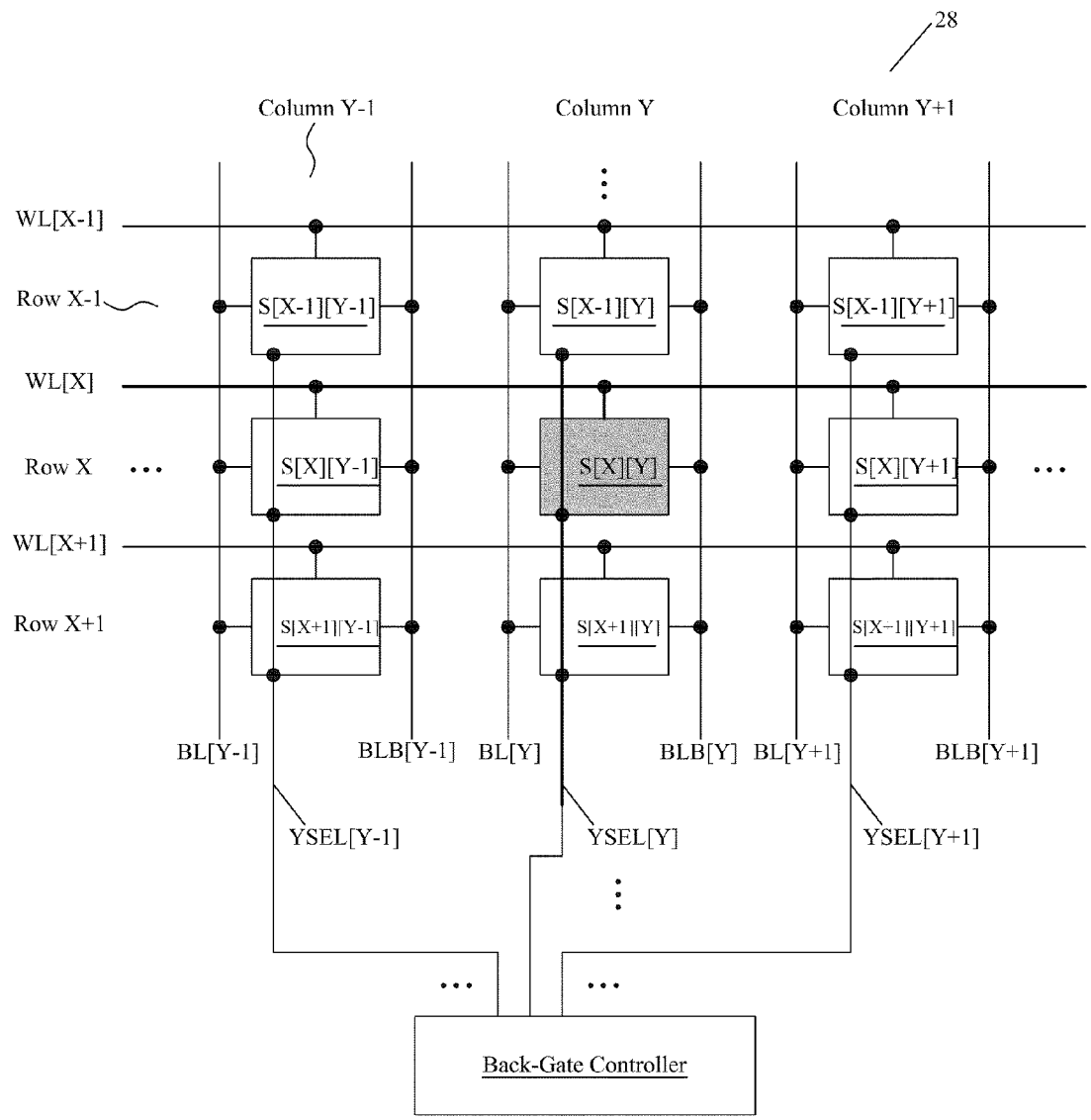
FIG. 3 illustrates an SRAM array, wherein back-gates of all pull-down transistors of the SRAM cells in a same column are interconnected, and are controlled by a back-gate controller.

FIG. 3 illustrates a portion of SRAM array 28 including a plurality of SRAM cells arranged in rows and columns. The SRAM cells are indicated as S followed by an integer indicating its row number and an integer indicating its column number, with both integers included in brackets. The word-lines WL, bit-lines BL and BLB, and Y-direction select lines are also marked using the respective row number or column number. The detailed structure of each of the SRAM cells in SRAM array 28 may be referred to in FIG. 2.

All Y-direction select lines YSEL may be connected to a back-gate controller, which controls the voltages on Y-direction select lines YSEL, so that different Y-direction select lines YSEL may have different voltages in a same operation, and a same Y-direction select line YSEL may have different voltages in different operations, as discussed in the preceding paragraphs. In an exemplary embodiment, the signals on Y-direction select lines YSEL may be generated by inverting the signals on the respective well-known column select lines (not shown), with the signal on each of the column select lines being inverted by an inverter (not shown) to generate a signal on the Y-direction select line YSEL in the same column. In this case, the back-gate controller may include an I/O controller that is connected to a plurality of column select lines, and a plurality of inverters (not shown), with each of the inverters connected to one of the column select lines.

Figure 4:
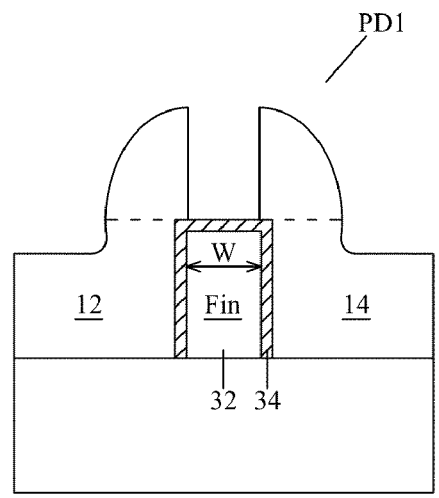
FIG. 4 illustrates a cross-sectional view of a dual-gate FinFET.

Pull-down transistors PD1, PD2, PD1', and PD2' as shown in FIG. 2 may be implemented using Fin field effect transistors (FinFET). An exemplary dual-gate FinFET PD1 is shown in FIG. 4, which illustrates a cross-sectional view of the FinFET. FinFET PD1 includes semiconductor fin 32, gate dielectric 34, front gate 14 on one of the sidewalls of fin 32, and back-gate 12 on the opposite sidewall of fin 32. It is appreciated that the naming of "front gate" and "back-gate" in a dual-gate transistor is relative, and may be inversed. Fin 32 preferably has a small width W so that when the channel controlled by front gate 14 and the channel controlled by back-gate 12 are both turned off, the entire fin is turned off. The formation of front gate 14 and back-gate 12 may include forming a gate electrode layer and patterning (or polishing) the gate electrode layer. During the patterning/polishing of the gate electrode layer, a portion of the gate electrode layer directly over fin 32 is etched to separate front gate 14 and the back-gate 12 from each other. The dual-gate pull-down transistors PD1, PD2, PD1' and PD2' may also have other implementations other than FinFETs. Alternatively, front gate 14 and back-gate 12 may be formed by polishing the gate electrode layer to remove all portions of the gate electrode layer over the top surface of gate dielectric 34. The top surfaces of the resulting front gate 14 and back-gate 12 are illustrated using dashed lines.

It is realized that although in the embodiments of the present invention, 6-T SRAM cells are illustrated, the concept of the present invention may be applied to other SRAM cells having a different number of transistors, and having different structures. One skilled in the art, with the teaching provided in the preceding paragraphs, will be able to realize the implementation details.

Figure 5:
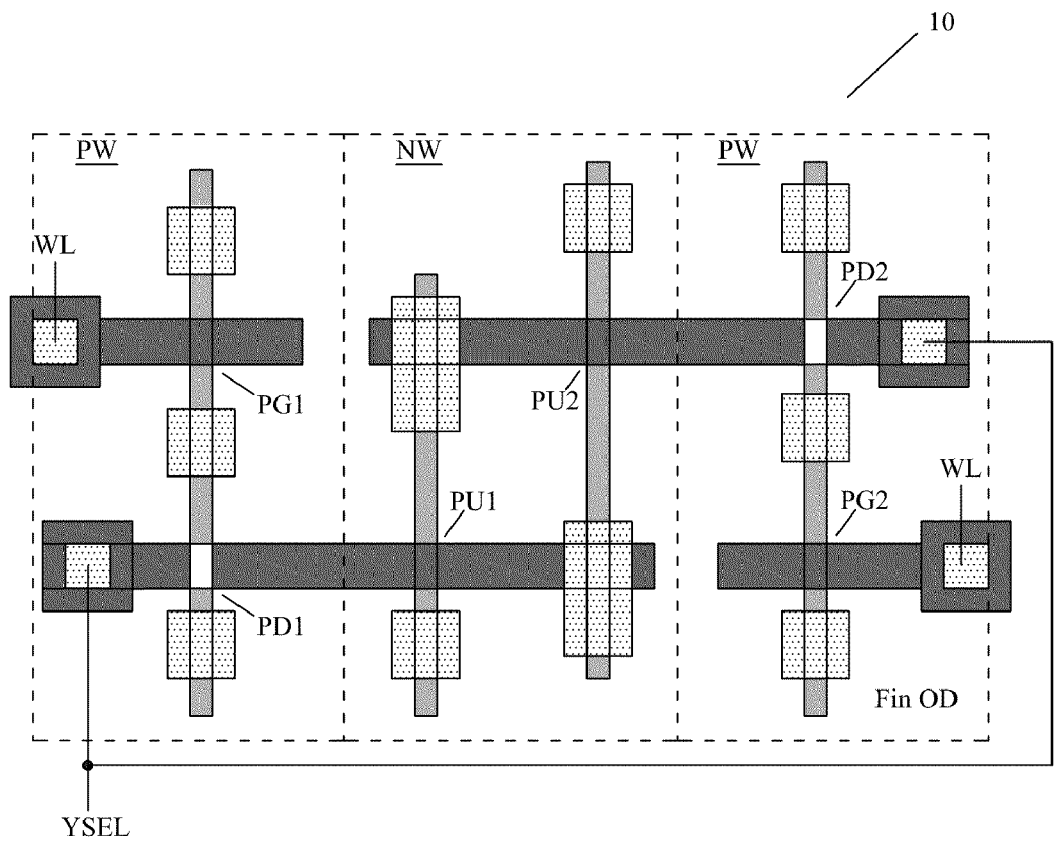
FIG. 5 illustrates an exemplary layout of an embodiment of the present invention.

FIG. 5 illustrates an exemplary layout of SRAM cell 10 as shown in FIG. 2, wherein like reference numerals are used to indicate like elements. It is noted that the embodiments of the present invention can be laid out without resorting to a zigzag patterned P-well or N-well region. Therefore, the embodiments of the present invention have good scalability. In addition, the embodiments of the present invention have improved read and write ability, improved reliability, and improved VCCmin. These improvements, however, are obtained with no chip-area penalty.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps. In addition, each claim constitutes a separate embodiment, and the combination of various claims and embodiments are within the scope of the invention.

What is claimed is:

1. An integrated circuit structure comprising:
 a static random access memory (SRAM) cell comprising:
  a first pull-up transistor, wherein the first pull-up transistor is a single-gate transistor;
  a first pull-down transistor forming a first inverter with the first pull-up transistor, wherein the first pull-down transistor comprises a front gate connected to a gate of the first pull-up transistor, and a back-gate decoupled from the front gate; and
  a back-gate controller coupled to the back-gate of the first pull-down transistor, wherein the back-gate controller is configured to apply a first voltage to the back-gate of the first pull-down transistor in a write operation of the SRAM cell, and apply a second voltage different from the first voltage to the back-gate of the first pull-down transistor in a read operation of the SRAM cell.

2. The integrated circuit structure of claim 1, wherein the SRAM cell further comprises:
 a second pull-up transistor; and
 a second pull-down transistor forming a second inverter with the second pull-up transistor, wherein the first inverter and the second inverter are cross-coupled, and wherein the second pull-down transistor comprises a front gate connected to a gate of the second pull-up transistor, and a back-gate coupled to the back-gate of the first pull-down transistor.

3. The integrated circuit structure of claim 2, wherein the back-gate of the first pull-down transistor is directly connected to the back-gate of the second pull-down transistor.

4. The integrated circuit structure of claim 1, wherein the first voltage is lower than a threshold voltage of the back-gate of the first pull-down transistor, and the second voltage is greater than the threshold voltage.

5. The integrated circuit structure of claim 1, wherein the first voltage is an electrical ground voltage, and the second voltage is substantially equal to a positive power supply voltage VDD of the SRAM cell.

6. The integrated circuit structure of claim 1, wherein the first voltage is a negative voltage.

7. The integrated circuit structure of claim 1, wherein the first pull-down transistor is a FinFET comprising a fin, and wherein the front gate is on a first sidewall of the fin, and the back-gate is on a second sidewall of the fin opposite the first sidewall.

8. An integrated circuit structure comprising:
a word-line extending in a first direction;
a first Y-direction select line extending in a second direction perpendicular to the first direction;
a first static random access memory (SRAM) cell coupled to the word-line and comprising:
  a first inverter comprising:
    a first pull-up transistor; and
    a first pull-down transistor coupled to the first pull-up transistor and comprising a first front gate and a first back-gate; and
  a second inverter cross-coupled to the first inverter and comprising:
    a second pull-up transistor; and
    a second pull-down transistor coupled to the second pull-up transistor and comprising a second front gate and a second back-gate, wherein the first back-gate and the second back-gate are connected to the first Y-direction select line;
a second SRAM cell coupled to the word-line and comprising an additional pull-down transistor, wherein the additional pull-down transistor comprises an additional front gate and an additional back-gate;
a second Y-direction select line connected to the additional back-gate and extending in the second direction; and
a back-gate controller comprising a first output coupled to the first Y-direction select line, and a second output coupled to the second Y-direction select line, wherein the back-gate controller is configured to apply a first voltage to the first Y-direction select line in a write operation, and apply a second voltage higher than the first voltage to the second Y-direction select line in the write operation, and wherein the first SRAM cell is a selected cell for the write operation, and the second SRAM cell is an unselected cell for the write operation.

9. The integrated circuit structure of claim 8, wherein the first pull-down transistor is a FinFET comprising a fin, and wherein the first front gate is on a first sidewall of the fin, and the first back-gate is on a second sidewall of the fin opposite the first sidewall.

10. The integrated circuit structure of claim 8, wherein the first pull-up transistor and the second pull-up transistor are single-gate transistors.

11. The integrated circuit structure of claim 8 further comprising a first pass-gate transistor coupled between the first inverter and a first bit-line, and a second pass-gate transistor coupled between the second inverter and a second bit-line, wherein the first pass-gate transistor and the second pass-gate transistor are single-gate transistors.

12. The integrated circuit structure of claim 8, wherein the back-gate controller is configured to apply a third voltage to the first Y-direction select line in a first operation of the first SRAM cell, and apply a fourth voltage different from the third voltage to the first Y-direction select line in a second operation of the SRAM cell.

13. The integrated circuit structure of claim 8, wherein the back-gate controller is configured to apply a voltage close to a positive power supply voltage of the first SRAM cell to the first Y-direction select line and the second Y-direction select line in a read operation.

14. The integrated circuit structure of claim 8, wherein the back-gate controller is configured to apply a negative voltage to the first Y-direction select line and the second Y-direction select line is in a sleep mode operation.

15. The integrated circuit structure of claim 8, wherein the first pull-up transistor and the second pull-up transistor are PMOS transistors, and the first pull-down transistor and the second pull-down transistor are NMOS transistors.

16. An integrated circuit structure comprising:
a word line extending in a row direction;
static random access memory (SRAM) cells arranged as an array comprising rows and columns, wherein SRAM cells in a same one of the rows are connected to the word line, and wherein each of the SRAM cells comprises:
  a first inverter coupled to a power supply voltage node and comprising:
    a first pull-up transistor; and
    a first pull-down transistor coupled to the first pull-up transistor, wherein the first pull-down transistor comprises a first front gate and a first back-gate; and
  a second inverter cross-coupled to the first inverter, and coupled to the power supply voltage node, the second inverter comprising:
    a second pull-up transistor; and
    a second pull-down transistor coupled to the second pull-up transistor, wherein the second pull-down transistor comprises a second front gate and a second back-gate, and wherein the first back-gate and the second back-gate are interconnected; and
Y-direction select lines extending in a column direction perpendicular to the row direction, wherein each of the Y-direction select lines is coupled to the first back-gate and the second back-gate of all of the SRAM cells in a same column.

17. The integrated circuit structure of claim 16, wherein the first pull-up transistor and the second pull-up transistor are single-gate transistors having gates connected to the front gate of the first pull-down transistor and the front gate of the second pull-down transistor, respectively.

18. The integrated circuit structure of claim 16 further comprising a back-gate controller comprising a plurality of outputs, wherein each of the plurality of outputs is connected to one of the Y-direction select lines.

19. The integrated circuit structure of claim 18, wherein the back-gate controller is configured to, in a write operation of a selected cell of the SRAM cells, apply a first low voltage to a selected one of the Y-direction select lines connected to the selected cell, and a high voltage to all of unselected Y-direction select lines connected to unselected ones of the SRAM cells.

20. The integrated circuit structure of claim 19, wherein the back-gate controller is further configured to, in a sleep mode operation of the SRAM cells, apply a second low voltage to all of the Y-direction select lines, and wherein the first low voltage has a voltage level higher than the second low voltage.

21. The integrated circuit structure of claim 18, wherein the back-gate controller is configured to, in a read operation of a selected one of the SRAM cells, apply a high voltage to all of the Y-direction select lines.

22. The integrated circuit structure of claim 18, wherein the back-gate controller is configured to, in a sleep mode operation of the SRAM cells, apply low voltages to all of the Y-direction select lines.

23. The integrated circuit structure of claim 22, wherein in the sleep mode operation of the SRAM cells, the low voltages applied to all of the Y-direction select lines are negative voltages.

* * * * *